United States Patent [19]
Stansbury

[11] Patent Number: 5,827,624
[45] Date of Patent: Oct. 27, 1998

[54] MASK MODIFICATION FOR FOCAL PLANE ON CONTACT PHOTOLITHOGRAPHY TOOL

[75] Inventor: Darryl Stansbury, Boise, Id.

[73] Assignee: Micron Display Technology, Inc., Boise, Id.

[21] Appl. No.: 774,378

[22] Filed: Dec. 30, 1996

[51] Int. Cl.[6] ...................................................... G03F 9/00
[52] U.S. Cl. ................................................. 430/5; 430/311
[58] Field of Search ............................... 430/5, 311, 312, 430/314

[56] References Cited

U.S. PATENT DOCUMENTS 5,620,832  4/1997  Sung et al. .............................. 430/311
5,670,296  9/1997  Tsai ........................................ 430/312

*Primary Examiner*—S. Rosasco
*Attorney, Agent, or Firm*—Hale and Dorr LLP

[57] ABSTRACT

The lower surface of a photolithographic mask contains recesses sized and adapted to receive upwardly-projecting features so that, when the mask is placed in position over the to-be-exposed and etched surface, the lower surface of the mask is in direct contact with or very closely adjacent (e.g., not more than about 5 or 6 microns above) the top of the resist layer. In the disclosed practice, the mask is quartz, the lower surface of the mask is pressed into contact with the resist before the resist is exposed, and the device being formed is a field emission device.

27 Claims, 5 Drawing Sheets

MASK MODIFICATION FOR FOCAL PLANE ON CONTACT PHOTOLITHOGRAPHY TOOL

GOVERNMENT RIGHTS

This invention was made with government support under Contract No. DABT63-93-C-0025 awarded by the Advanced Research Projects Agency (ARPA). The government has certain rights in this invention.

FIELD OF INVENTION

This invention relates to photolithography and, more particularly, to modification of masks used in contact photolithography to provide better resolution in the fabrication of field emissions devices ("FEDs").

BACKGROUND OF INVENTION

Currently, in the world of computers and elsewhere, the dominant technology for constructing flat panel displays is liquid crystal display ("LCD") technology and a current benchmark for flat panel displays is active matrix LCDs ("AMLCDs"). The drawbacks of flat panel displays constructed using AMLCD technology are the cost, power consumption, angle of view, smearing of fast moving video images, temperature range of operation, and, in some, the environmental concerns of using mercury vapor in the AMLCD's backlight.

A competing technology is cathode ray tube ("CRT") technology. In this technology area, there have been many attempts in the last 40 years to develop a practical flat CRT. The desire to develop a flat CRT has been to make use of the advantages of the cathodoluminescent process for the generation of light, The point of failure in the development of flat CRTs has been centered around the complexities in the electron source and the mechanical structure.

In recent years, FED technology has come into favor as a technology for developing low power, flat panel displays. FED technology has the advantage of using an array of cold cathode emitters and cathodoluminescent phosphors for the efficient conversion of energy from an electron beam into visible light. Part of the desire to use FED technology for the development of flat panel displays is that it is very conducive for producing flat screen displays that will have high performance, low power, and lighter weight. Some of the specific recent advances associated with FED technology which have made it a more viable alternative for the development of low power, flat panel displays are large area 1 micron lithography, large area thin-film processing capability, high tip density for the electron emitting micropoints, a lateral resistive layer, anode switching, new types of emitter structures and materials, and low voltage phosphors.

Referring to FIG. 1, representative portions of a typical prior art FED device are shown generally at 10. As is well known, FED technology operates on the principle of cathodoluminescent phosphors being excited by cold cathode field emission electrons. The general structure of FED device 100 includes a cathode assembly 6 and an anode assembly 8 separated from each other by spacers 4. Cathode assembly 6 has a substrate or baseplate 12 on which a thin conductive structure 14 is formed. Silicon baseplate 12 may be a single crystal silicon layer. The thin conductive structure 14 may be formed from doped polycrystalline silicon that is deposited on the baseplate, and serves as the emitter electrode. The thin conductive structure 14 is usually deposited on baseplate 12 in strips that are electrically connected. Strips 14a, 14b and 14c are shown in FIG. 1. The number of strips for a particular device will depend on the size and desired performance of the FED device. Collectively, the electrically connected strips serve as the emitter electrode.

A resistive layer (not shown) of, e.g., amorphous silicon may be deposited on top of the conductive strips 14. At predetermined sites on the respective resistive layer (if present) and strips 14 a pattern of spaced-apart conical cold cathode emitters, or micropoints, 18 is formed. In FIG. 1, a single micropoint 18 is shown on the illustrated portion of strip 14a, a row of four micropoints 18 is shown on strip 14 between spacers 4, and a single micropoint 18 is shown on the illustrated portion of strip 14c.

Also formed on conductive layer 14 (or on the resistive layer, if present) is an electrically insulating (e.g., a dielectric) layer 20 on which, in turn, a conductive layer 22 is disposed. Conductive layer 22, which typically is metal, forms a gate electrode which functions as an extraction grid to control the emission of electrons from micropoint emitters 18.

Anode assembly 8 has a transparent (e.g., glass) substrate 24 and a transparent conductive layer 26 formed over substrate 24 (on the side thereof facing cathode assembly 6). A black matrix grill 25 is formed over conductive layer to define pixel regions, and a cathodoluminescent coating (e.g., a red, green or blue phosphor, designated 28r, 28g and 28b, respectively) is deposited in the defined pixel regions of the grill 25. It will be recognized that the principal purpose of the black matrix grill 25 is to provide improved contrast in the FED display. In some embodiments, the black matrix grill 25 may be omitted and the red, green and blue phosphors simply deposited on the proper predetermined regions of the bottom surface of conductive layer 26.

The entire anode assembly 8 is positioned a predetermined distance from cathode assembly 6 and from micropoint emitters 18 by spacers 4.

A power supply 30 is electrically coupled to conductive layer 26 of anode assembly 8 and to conductive layers 14 (under micropoint emitters 18) and 22 (of the gate electrode) of cathode assembly 6. A vacuum in the space between cathode 6 and anode 8 provides a relatively clear path for electrons emitted from micropoints 18. The emitted electrons strike cathodoluminescent coating 28, which emits light to form a video image on a display screen created by anode 8.

In practice, cathode assembly 6 and anode assembly 8 are formed using conventional semiconductor device fabrication techniques. In the manufacture of the cathode assembly, the various layers that will form the components of the cathode assembly (i.e., conductive layer 14, the resistive layer if placed on conductive layer 14), the layer 58 from which micropoints 18 and dielectric layer portions 20 will be formed, and the conductive layer 22 that will form the extraction grid are first deposited on substrate 12, and portions of the layers are successively removed, starting at the top layer (i.e., the conductive layer 22 that will form the extraction grid) farthest from substrate 12 and moving downwardly through the successive layers, to form the features of the cathode assembly. The removal process typically employs a photolithographic process to define the regions from which material is to be removed, and the material itself is removed by etching or some other conventional semi-conductor processing technique.

Anode assembly 8 is typically manufactured by depositing successively defined features on the (as viewed) lower surface of transparent substrate 24, starting with transparent conductive layer 26. The next feature to be formed is the spacers 4 which project downwardly (e.g., about 150 microns) from conductive layer 26. The black matrix grill 25 is then formed using a photolithographic process to define the "holes" or pixel regions and plating (e.g., using electrophoresis) the black matrix grill layer onto the entire surface except for the "holes". Finally, the red, green and blue phosphors are deposited into the holes in three successive steps, in each of which a photolithographic process leaves open only one of the holes of each set of three "holes" and the desired color phosphor is then deposited into the "open" holes. Finally, a protective binder (not shown) is coated over the entire phosphor/matrix surface.

There are two well-known types of photolithography, projection and contact. Projection photolithography is considerably more expensive since the cost of the required equipment is much higher. However, projection photolithography typically provides better resolution and dimensional control, particularly in circumstances in which it is not possible to place the mask in close proximity to or in contact with the resist layer.

In contact photolithography, a patterned glass photolithography mask usually must be placed directly on, or very close to, the resist layer that is to be patterned, particularly if resolution and dimensional control is critical. Typically, this is accomplished by depositing a photoresist layer, placing a patterned glass photolithographic mask over and in contact with the resist layer, and then exposing the resist and removing material below unexposed portions of the resist in the usual manner. In circumstances in which it is possible to place the pattern of the photolithographic mask in direct contact with the photoresist layer, precisely placed and configured features 4 can be formed using contact photolithography.

FIG. 2 schematically illustrates anode assembly 8 after the spacers 4 have been formed and conductive layer 26 has been deposited. It will be appreciated that the spacers 4 project a considerable distance from conductive layer 26, and that the black matrix grill 25 and phosphors 28 will be plated onto the conductive layer 26 at thicknesses that are considerably less than the height of spacers 4. It is possible accurately to define the matrix grill and three phosphor patterns on respective ones of the successive respective photoresist layers that will be used in the course of plating the grill and phosphors using projection photolithographic techniques, but this demands the use of expensive equipment. Using contact photolithographic techniques, there will be a considerable loss of resolution and dimensional control. For example, the mask 52 used to expose the photoresist layer 50 deposited on conductive layer and thus to define the pattern for matrix grill 25 must be spaced a considerable distance (substantially equal to the height of spacers 4) from the resist layer 50 rather than being in contact with it.

The same situation arises if the spacers 4 are formed on cathode assembly 6 rather than on the anode assembly 8. In this latter situation, illustrated in FIG. 3, the spacers 4 project a substantial distance above the top of the thin metal layer 22 that must next be etched to form the gate electrode and the thicker underlying dielectric layer 58 that must be etched to form the structure defining micropoints 18. Thus, the photolithographic mask 63 used to expose a thinner photoresist layer 61 would again have to be spaced a considerable distance (again substantially equal to the height of spacers 4) above the resist layer 60 rather than being in contact with it.

Accordingly, it is a principal object of the present invention to enable relatively inexpensive contact photolithography precisely to form features that, because they are spaced a substantial distance below the tops of already-formed and upwardly-extending features, previously could be precisely formed only using much more expensive projection photolithographic techniques.

SUMMARY OF INVENTION

The invention features providing a photolithographic mask the lower surface of which contains recesses sized and adapted to receive features projecting above the to-be-exposed resist layer, so that, when the mask is placed in position over the to-be-exposed resist, the lower surface of the mask is in direct contact with or very closely adjacent (e.g., not more than about 5 or 6 microns above) the top of the resist layer. In preferred practice, the mask is quartz or glass, most preferably quartz, and the adjacent surface of the mask is pressed into contact with the resist before the resist is exposed.

DETAILED DESCRIPTION

Figure 3:
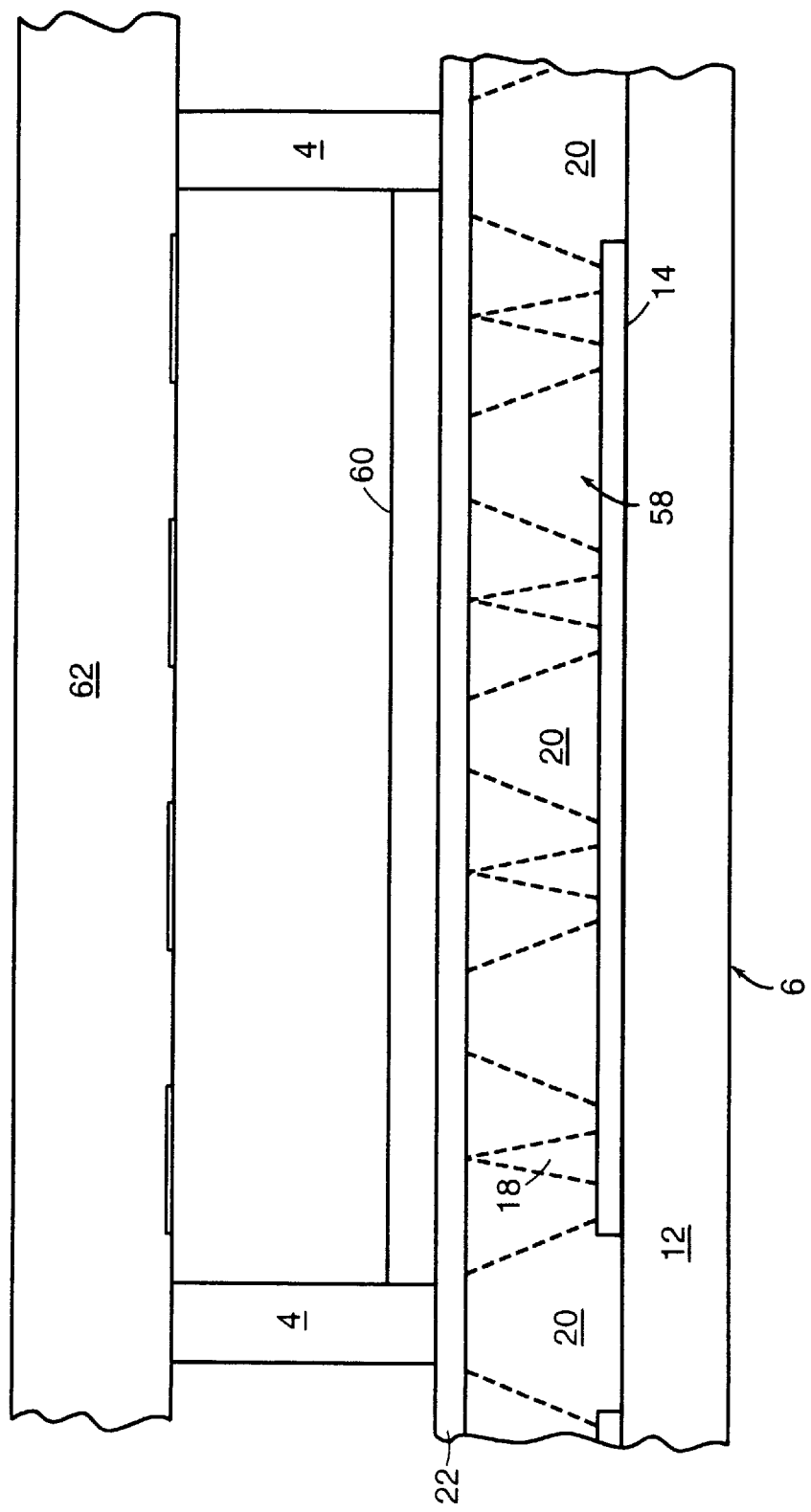
Figure 4:
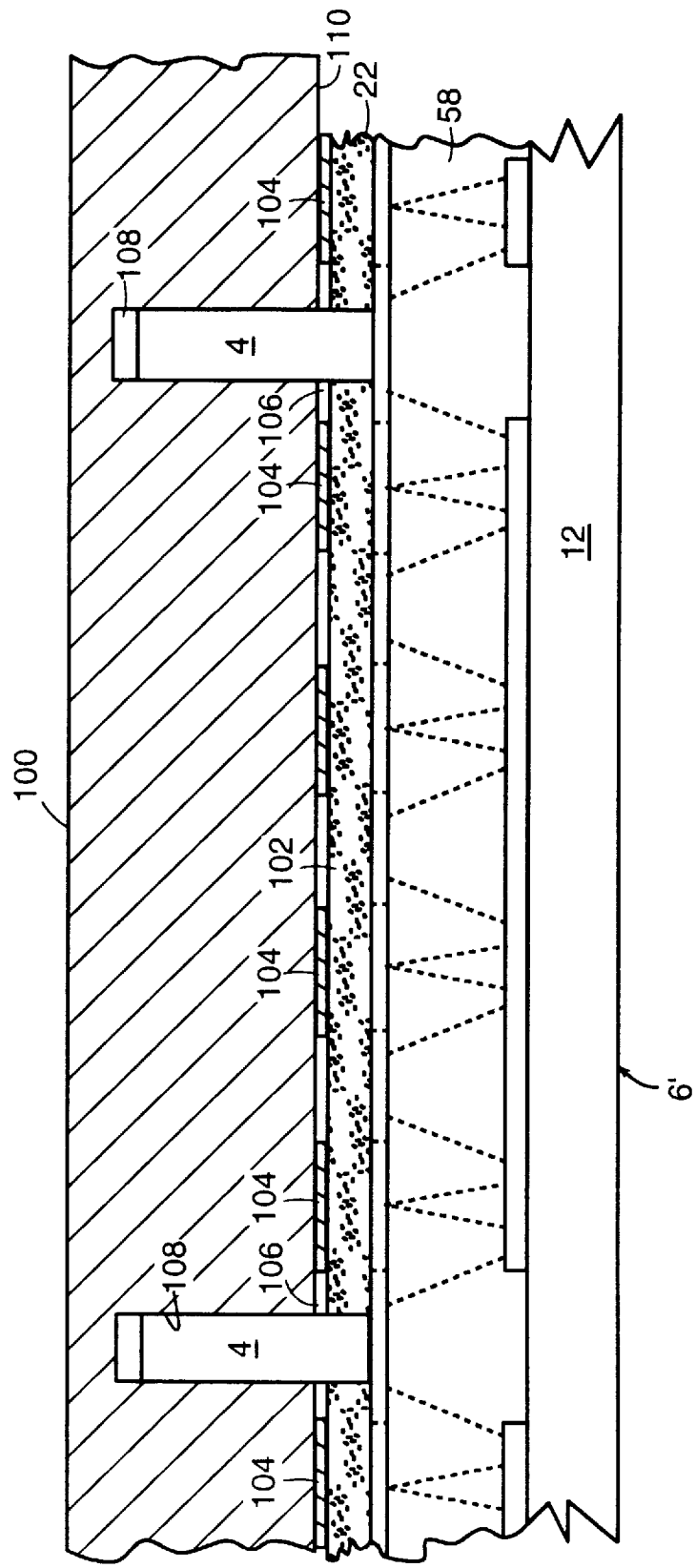
FIGS. 4 and 5 are sectional schematics illustrating the present invention.

FIG. 4 shows the partially fabricated cathode assembly 6' of a FED, and a glass photolithography mask 100 constructed in accord with the present invention. As will be evident, the stage of fabrication of cathode assembly 6' is substantially as shown in FIG. 3. FIG. 4 also shows a desirably thin photoresist layer 102 deposited on metal layer 22 in regions between spacers 4, preparatory to etching layers 22 and 58 to form the extraction grid and micropoints.

Mask 100 includes, as is conventional, a number of patterned regions 104 the pattern of each of which is sized and arranged for exposing a respective desired portion of photoresist layer 102. In accord with the present invention, mask 100 also includes regions 106, outside patterned regions 104, which include recesses 108 which project upwardly from the bottom surface 110 of mask 100 into the body of the mask a distance substantially equal (or as shown slightly greater than) to the vertical height (above photoresist layer 54) of spacers 4.

As shown, recesses 108 are positioned such that each spacer 4 will fit into one of the recesses 108 when mask 100 is placed over resist layer 102 with each patterned region 104 precisely positioned relative the respective to-be-exposed-and-etched region of resist layer 102. Since the height of each recess 108 is greater than the distance that spacers 4 project above photoresist layer 102 (and typically about equal to or slightly greater than the overall height of the spacers), the patterned regions 104 on mask 100 are in direct contact with (and typically are forced slightly downwardly into) the to-be-exposed-and-etched regions of the photoresist layer 102. Accordingly, when the photoresist layer 102 is exposed through mask 100 in the conventional manner, the to-be-etched regions of the mask will be precisely defined.

In the above-described preferred embodiment, one spacer 4 is positioned along each of the opposite sides of an array of micropoints 18 of cathode assembly 6'. In other embodiments, more spacers may be provided, e.g., along all four sides of the micropoint array. In any event, it will be noted that the recesses are designed to precisely fit over the spacers 4, and thus locate mask 100 precisely relative to the photoresist layer.

With the mask 100 thus precisely located, the photoresist layer 102 may be exposed in the usual manner and, after the exposed regions of the mask have been removed, the underlying layers 22, 58 may be etched to form the desired features in them.

Figure 1:
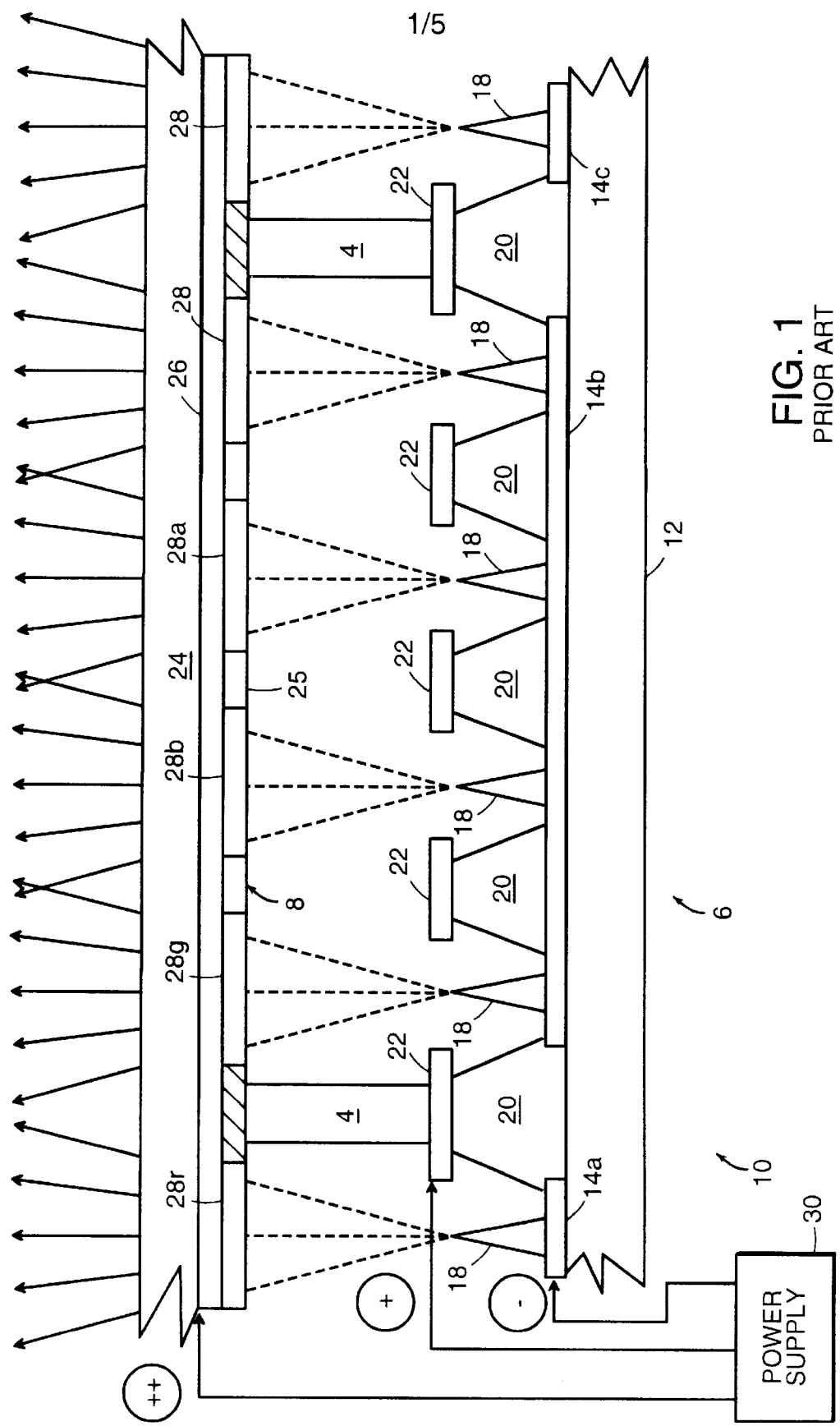
FIG. 1, as discussed above, is a sectional view of a field emission display device.
Figure 2:
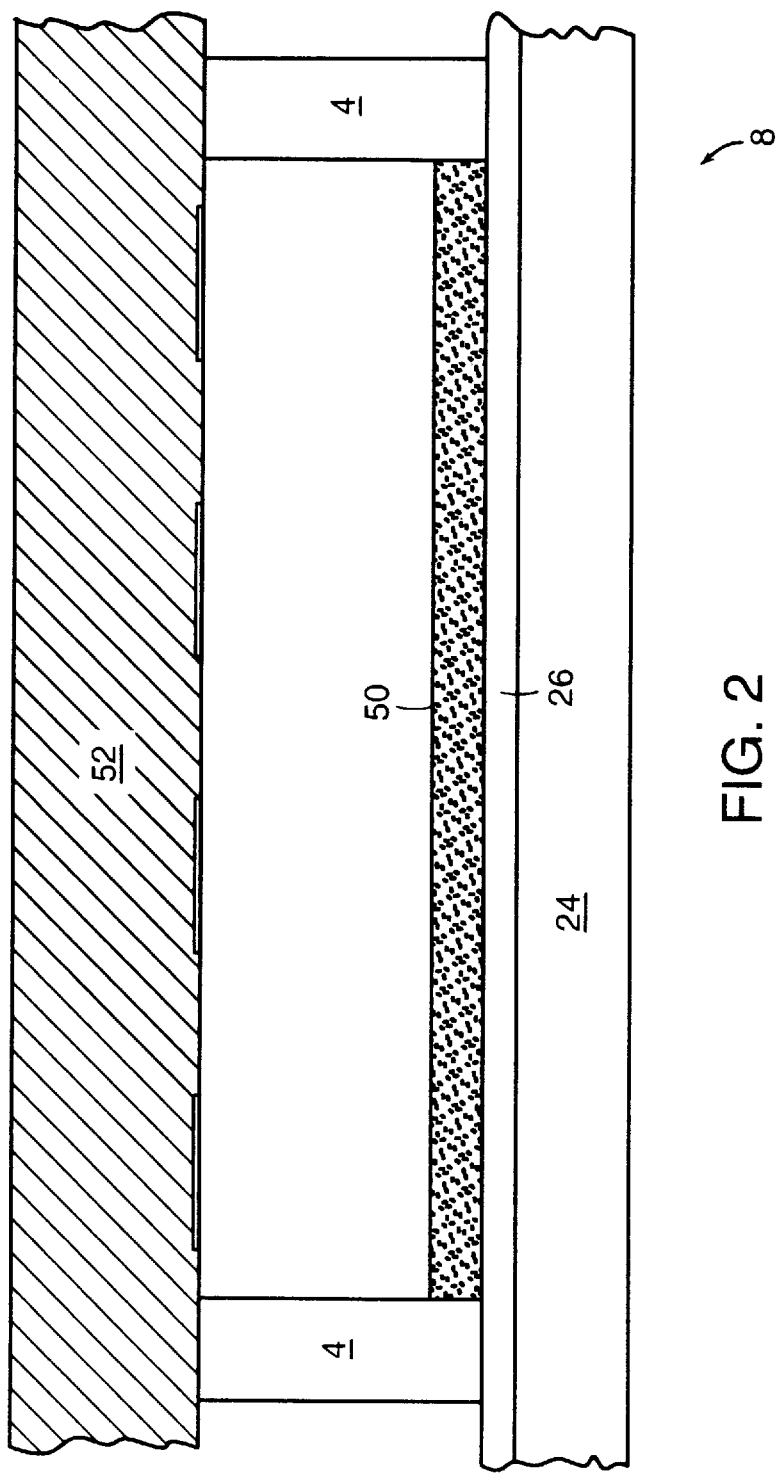
FIGS. 2, and 3 are sectional schematics illustrating prior art procedures used to form the device of FIG. 1.
Figure 5:
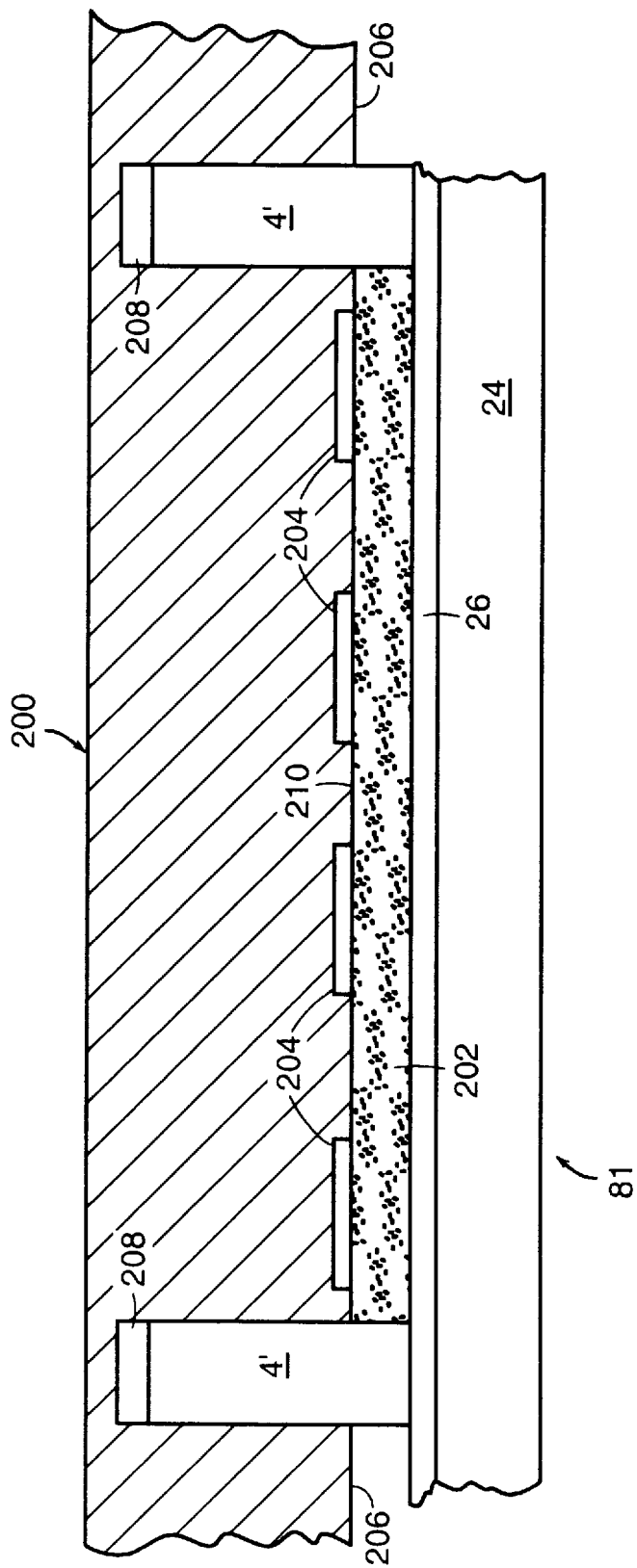

FIG. 5 illustrates use of the invention in connection with the manufacture of an anode assembly 8'. As shown, the stage of assembly of cathode assembly 8' is substantially as shown in FIG. 2. Additionally, a desirably thin photoresist layer 202 has been deposited on conductive layer 26 preparatory to depositing the black matrix grill 25 on the conductive layer.

The mask 200 used in exposing photoresist layer 202 includes, again conventionally, patterned regions 204 which are sized and adapted for exposing desired portions of photoresist layer 202. Also in accord with the present invention, the regions 206 of the mask, outside patterned region 204, includes recesses 208 which project from the surface 210 of mask 200 into the body of the mask a distance substantially equal to (or as shown slightly greater than) the vertical height (below photoresist layer 202) of spacers 4'.

Similar to the procedure previously discussed, recesses 208 are positioned so that each spacer 4' will fit into a respective recess when the mask 200 is precisely positioned relative to resist layer 202; and the relative vertical dimensions of the recesses and spacers are such that the patterned regions on the mask are in direct contact with the photoresist layer. With the mask thus precisely located, the photoresist layer is exposed in the usual manner, the exposed regions of the mask removed, and the black matrix grill deposited into the removed regions.

The process is repeated, with different masks, to deposit the different color phosphors into the proper open areas on the black matrix grill. If, for example, the red phosphors are to be deposited first, a photoresist layer is deposited over the black matrix grill 25 and exposed portions of the conducive layer 26, a mask patterned only for the red phosphor regions and including recesses substantially identical to recesses 208 is placed over the deposited photoresist, the photoresist over the red phosphor regions is exposed and removed, and the red phosphor is deposited into the thus-exposed regions.

It will be appreciated that any conventional procedure may be employed to pattern the photoresist mask, expose the photoresist layer, and thereafter either etch or deposit material on the underlying layer(s) to form the desired features of the cathode or anode assemblies. It will also be appreciated that, in other embodiments and practices of the invention, the recesses in the photoresist mask may be made somewhat larger than the projecting spacers and the mask may be precisely located relative to the underlying photoresist layer using, for example, conventional techniques.

Additionally, in other embodiments and practices of the invention, the mask may be made of materials other than glass, and depending on the number of vertical projections within or near the to-be-exposed region of the photoresist layer and the overall size of the mask, various numbers of recesses may be required. In general, recesses should be provided to accommodate each significant (e.g., more than a few microns high) vertical projection within the overall boundaries of the mask, and the relative thickness of the mask and height of the vertical projections may be such that the recesses and vertical projections extend completely through the mask.

These and other embodiments will be within the scope of the following claims.

What is claimed is:

1. In a photolithographic process in which a mask is used to expose desired regions of a photoresist layer, that improvement wherein said mask contains recesses sized and adapted to receive features projecting above said photoresist layer such that, when said mask is placed in position over said resist layer, said features are received within said recesses and the surface of said mask is positioned below the tops of said features and closely adjacent the top of the resist layer.

2. The process of claim 1 wherein the mask is quartz or glass.

3. The process of claim 1 wherein said recesses are sized and adapted to receive substantially all portions of said features projecting above the upper surface of said photoresist layer, and the lower surface of said mask is placed in contact or very near proximity with the upper surface of said photoresist layer.

4. The process of claim 3 wherein said lower surface of said mask is placed in contact with said upper surface of said photoresist layer.

5. The process of claim 1 wherein said features are part of a field emission device.

6. A photoresist mask for use in forming features of a device that lie below the tops of previously formed features, said mask including a surface having a first patterned region for contacting a photoresist layer deposited over portions of said device to be processed to form said to-be-formed features and a second region defining recesses extending upwardly from said surface, said recesses being sized and adapted to receive said previously formed features.

7. The mask of claim 6 wherein said second region including said recess is exterior of said first patterned region.

8. The mask of claim 6 wherein the mask is glass or quartz.

9. The mask of claim 6 wherein said photoresist layer has an upper surface, said previously formed features project upwardly above the top of said upper surface of said photoresist layer, and said recesses are sized and adapted to receive substantially all of portions of said features projecting above the upper surface of said photoresist layer when the surface of said mask is placed in contact or close proximity with the upper surface of said photoresist layer.

10. The mask of claim 9 wherein said lower surface of said mask is placed in contact with said upper surface of said photoresist layer.

11. In the process of making a field emission device including a cathode assembly, an anode assembly, and a plurality of spacers intermediate and separating said assemblies, that improvement wherein said process includes the steps of:

forming said spacers such that said spacers project outwardly from a surface of one of said assemblies;

depositing a photoresist layer on said surface, the thickness of said photoresist layer being such that said spacers project beyond said photoresist layer, providing a mask having a lower surface arranged to be positioned in close proximity with said photoresist layer, said mask including a plurality of recesses projecting inwardly into said mask from said lower surface thereof, each of said recesses being sized and adapted to receive at least one of said spacers, and positioning said mask relative to said photoresist layer such that said spacers are received at least partially within said recesses and said lower surface of said mask is positioned below the tops of said spacers and closely adjacent said resist layer.

12. The process of claim 11 wherein at least one of said recesses is arranged to engage the periphery of a said spacer and precisely to locate said mask relative to said resist layer.

13. The process of claim 11 wherein the thickness of said mask is greater than the distance that said spacers project above said resist layer.

14. The process of claim 11 wherein said process includes forming said cathode assembly by depositing a plurality of successive layers on a substrate and thereafter successively removing portions of said layers to form features of said cathode assembly.

15. The process of claim 11 wherein said process includes forming said anode assembly by depositing phosphors onto said surface.

16. In the process of making a device having a substrate and features projecting upwardly from a surface of said substrate, that improvement wherein said process includes the steps of:

depositing a photoresist layer, the thickness of said photoresist layer being such that said features project upwardly above said photoresist layer, providing a mask having a lower surface arranged to be positioned in close proximity with said photoresist layer, said mask including a plurality of recesses projecting upwardly from said lower surface thereof, each of said recesses being sized and adapted to receive at least one of said features, and positioning said mask relative to said photoresist layer such that said features are received at least partially within said recesses and said lower surface of said mask is positioned below the tops of said features and closely adjacent said resist layer.

17. The process of claim 16 wherein at least one of said recesses is arranged to engage a said feature and precisely to locate said mask relative to said resist layer.

18. The process of claim 16 wherein the thickness of said mask is greater than the distance that said features project above said resist layer.

19. The process of claim 16 wherein said mask includes a lower surface having a first patterned region for contacting said photoresist layer over portions of said device to be processed, and a second region defining said recesses.

20. The process of claim 19 wherein said second region of said mask including said recesses is exterior of said first patterned region.

21. The process of claim 16 wherein the mask is glass or quartz.

22. The process of claim 16 in which features are formed by depositing a plurality of successive layers on a substrate and thereafter successively removing portions of said layers to form features of said device.

23. The process of claim 16 in which features are formed by depositing the material forming said features onto said substrate.

24. A method of masking a reactive layer on a semiconductor wafer, comprising the steps of:

providing said semiconductor substrate having features defined thereon, said features extending outwardly from a substrate to a first level;

forming a reactive layer on said substrate, said reactive layer extending to a second level that is closer to said substrate than is said first level; and placing a mask proximate said reactive layer, said mask having a first surface placed closer to said substrate than said first level.

25. The method of claim 24, wherein said reactive layer comprises a photo-active composition.

26. A method of manufacturing a field emission display assembly, comprising the steps of:

providing a substrate;

forming a plurality of structures on said substrate, a first plurality of said structures extending to a first level above said substrate;

forming a patternable layer supported by said substrate, said patternable layer extending to a second level, said second level being closer to said substrate than is said first level;

placing a mask pattern having a first surface proximate said second level with said first surface placed closer to said substrate than said first level.

27. The method of claim 26 where said reactive layer comprises photoresist.

* * * * *